(12) United States Patent
Baptist et al.

(10) Patent No.: US 10,922,181 B2
(45) Date of Patent: *Feb. 16, 2021

(54) USING STORAGE LOCATIONS GREATER THAN AN IDA WIDTH IN A DISPERSED STORAGE NETWORK

(71) Applicant: International Business Machines Corporation, Armonk, NY (US)

(72) Inventors: Andrew D. Baptist, Mt. Pleasant, WI (US); Jason K. Resch, Chicago, IL (US); Wesley B. Leggette, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 105 days.

This patent is subject to a terminal disclaimer.

(21) Appl. No.: 16/138,459

(22) Filed: Sep. 21, 2018

(65) Prior Publication Data
US 2019/0026186 A1    Jan. 24, 2019

Related U.S. Application Data

(63) Continuation-in-part of application No. 15/350,672, filed on Nov. 14, 2016, now Pat. No. 10,346,250,
(Continued)

(51) Int. Cl.
*G06F 11/00* (2006.01)
*G06F 11/14* (2006.01)
(Continued)

(52) U.S. Cl.
CPC .......... *G06F 11/1435* (2013.01); *G06F 3/064* (2013.01); *G06F 3/067* (2013.01);
(Continued)

(58) Field of Classification Search
CPC ............ G06F 11/1008; G06F 11/1064; G06F 11/1068; G06F 11/1072
(Continued)

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Chung; An Automatic Data Segmentation Method for 3D Measured Data Points; National Taiwan University; pp. 1-8; 1998.
(Continued)

*Primary Examiner* — Sarai E Butler
(74) *Attorney, Agent, or Firm* — Garlick & Markison; Timothy W. Markison; Timothy D. Taylor (57) ABSTRACT

A method comprises encoding, by a DS processing unit of a dispersed storage network (DSN), a data segment using an information dispersal algorithm with a first pillar width number to produce a set of encoded data slices. The method continues by generating a set of DSN addresses for the set of encoded data slices based on the first pillar width number, a second pillar width number and a DSN address mapping function. The method continues by identifying, based on the DSN addresses, a first group of storage units of a set of storage units that includes the second width pillar number of storage units and where the first group of storage units includes the first pillar width number of storage units. The method continues by sending the set of encoded data slices to the first group of storage units in accordance with the set of DSN addresses.

14 Claims, 8 Drawing Sheets

Related U.S. Application Data which is a continuation of application No. 14/527,139, filed on Oct. 29, 2014, now Pat. No. 9,594,639.

(60) Provisional application No. 61/924,196, filed on Jan. 6, 2014.

(51) Int. Cl.

| | | |
|---|---|---|
| H04L 29/08 | (2006.01) | |
| H03M 13/35 | (2006.01) | |
| G06F 3/06 | (2006.01) | |
| G06F 11/10 | (2006.01) | |
| G06F 16/00 | (2019.01) | |
| H04L 1/00 | (2006.01) | |
| H03M 13/37 | (2006.01) | |
| H03M 13/15 | (2006.01) | |

(52) U.S. Cl.
CPC ........ *G06F 3/0619* (2013.01); *G06F 11/1076* (2013.01); *G06F 16/00* (2019.01); *H03M 13/353* (2013.01); *H03M 13/3761* (2013.01); *H04L 1/00* (2013.01); *H04L 1/0057* (2013.01); *H04L 1/0076* (2013.01); *H04L 67/06* (2013.01); *H04L 67/1097* (2013.01); *G06F 2211/1028* (2013.01); *H03M 13/1515* (2013.01)

(58) Field of Classification Search
USPC ........................................................ 714/6.11
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,035,914 B1 | 4/2006 | Payne et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 9,594,639 B2 | 3/2017 | Khadiwala et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0028673 A1 | 2/2003 | Lin et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0161679 A1* | 6/2011 | Grube ................... H04L 63/10 713/193 | |
| 2011/0182424 A1* | 7/2011 | Grube ................... G06F 21/72 380/43 | |
| 2011/0185141 A1* | 7/2011 | Dhuse ................ H04L 67/1097 711/165 | |
| 2012/0109885 A1* | 5/2012 | Grube ................. G06F 11/0727 707/609 | |
| 2012/0290868 A1* | 11/2012 | Gladwin ............. G06F 11/0727 714/4.1 | |
| 2013/0046973 A1* | 2/2013 | Resch ................... H04L 9/0877 713/156 | |
| 2013/0086377 A1* | 4/2013 | Cilfone ................. H04L 9/321 713/156 | |
| 2013/0108048 A1* | 5/2013 | Grube ................... H04W 12/02 380/270 | |
| 2013/0111166 A1* | 5/2013 | Resch .................. G06F 11/073 711/162 | |
| 2013/0138206 A1* | 5/2013 | Sudhir ..................... A61F 2/82 623/1.38 | |
| 2013/0151581 A1* | 6/2013 | Leggette ............. G06F 11/1076 709/201 | |
| 2013/0198560 A1* | 8/2013 | Grube ................. G06F 11/2094 714/6.2 | |
| 2013/0238900 A1* | 9/2013 | Leggette ............. G06F 11/1451 713/165 | |
| 2014/0040660 A1* | 2/2014 | Gladwin ................. H03M 13/05 714/6.2 | |
| 2014/0068259 A1* | 3/2014 | Resch ................... H04L 9/0861 713/167 | |
| 2014/0351674 A1 | 11/2014 | Grube et al. | |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.
Legg; Lightweight Directory Access Protocol (LDAP): Syntaxes and Matching Rules; IETF Network Working Group; RFC 4517; Jun. 2006; pp. 1-50.
Plank, T1: Erasure Codes for Storage Applications; FAST2005, 4th Usenix Conference on File Storage Technologies; Dec. 13-16, 2005; pp. 1-74.
Rabin; Efficient Dispersal of Information for Security, Load Balancing, and Fault Tolerance; Journal of the Association for Computer Machinery; vol. 36, No. 2; Apr. 1989; pp. 335-348.
Satran, et al.; Internet Small Computer Systems Interface (iSCSI); IETF Network Working Group; RFC 3720; Apr. 2004; pp. 1-257.
Sciberras; Lightweight Directory Access Protocol (LDAP): Schema for User Applications; IETF Network Working Group; RFC 4519; Jun. 2006; pp. 1-33.
Sermersheim; Lightweight Directory Access Protocol (LDAP): The Protocol; IETF Network Working Group; RFC 4511; Jun. 2006; pp. 1-68.
Shamir; How to Share a Secret; Communications of the ACM; vol. 22, No. 11; Nov. 1979; pp. 612-613.
Smith; Lightweight Directory Access Protocol (LDAP): String Representation of Search Filters; IETF Network Working Group; RFC 4515; Jun. 2006; pp. 1-12.
Smith; Lightweight Directory Access Protocol (LDAP): Uniform Resource Locator; IETF Network Working Group; RFC 4516; Jun. 2006; pp. 1-15.
Wildi; Java iSCSi Initiator; Master Thesis; Department of Computer and Information Science, University of Konstanz; Feb. 2007; 60 pgs.
Xin, et al.; Evaluation of Distributed Recovery in Large-Scale Storage Systems; 13th IEEE International Symposium on High Performance Distributed Computing; Jun. 2004; pp. 172-181.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): Directory Information Models; IETF Network Working Group; RFC 4512; Jun. 2006; pp. 1-49.
Zeilenga; Lightweight Directory Access Protocol (LDAP): Internationalized String Preparation; IETF Network Working Group; RFC 4518; Jun. 2006; pp. 1-14.
Zeilenga; Lightweight Directory Access Protocol (LDAP): String Representation of Distinguished Names; IETF Network Working Group; RFC 4514; Jun. 2006; pp. 1-15.

* cited by examiner

USING STORAGE LOCATIONS GREATER THAN AN IDA WIDTH IN A DISPERSED STORAGE NETWORK

CROSS-REFERENCE TO RELATED APPLICATIONS

The present U.S. Utility patent application claims priority pursuant to 35 U.S.C. § 120 as a continuation-in-part of U.S. Utility application Ser. No. 15/350,672, entitled "CONFIGURING STORAGE RESOURCES OF A DISPERSED STORAGE NETWORK", filed Nov. 14, 2016, which claims priority pursuant to 35 U.S.C. § 120 as a continuation of U.S. Utility application Ser. No. 14/527,139, entitled "CONFIGURING STORAGE RESOURCES OF A DISPERSED STORAGE NETWORK", filed Oct. 29, 2014, now as issued U.S. Pat. No. 9,594,639, which claims priority pursuant to 35 U.S.C. § 119(e) to U.S. Provisional Application No. 61/924,196, entitled "CONFIGURING STORAGE SLOTS IN A DISPERSED STORAGE NETWORK", filed Jan. 6, 2014, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to dispersed storage error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
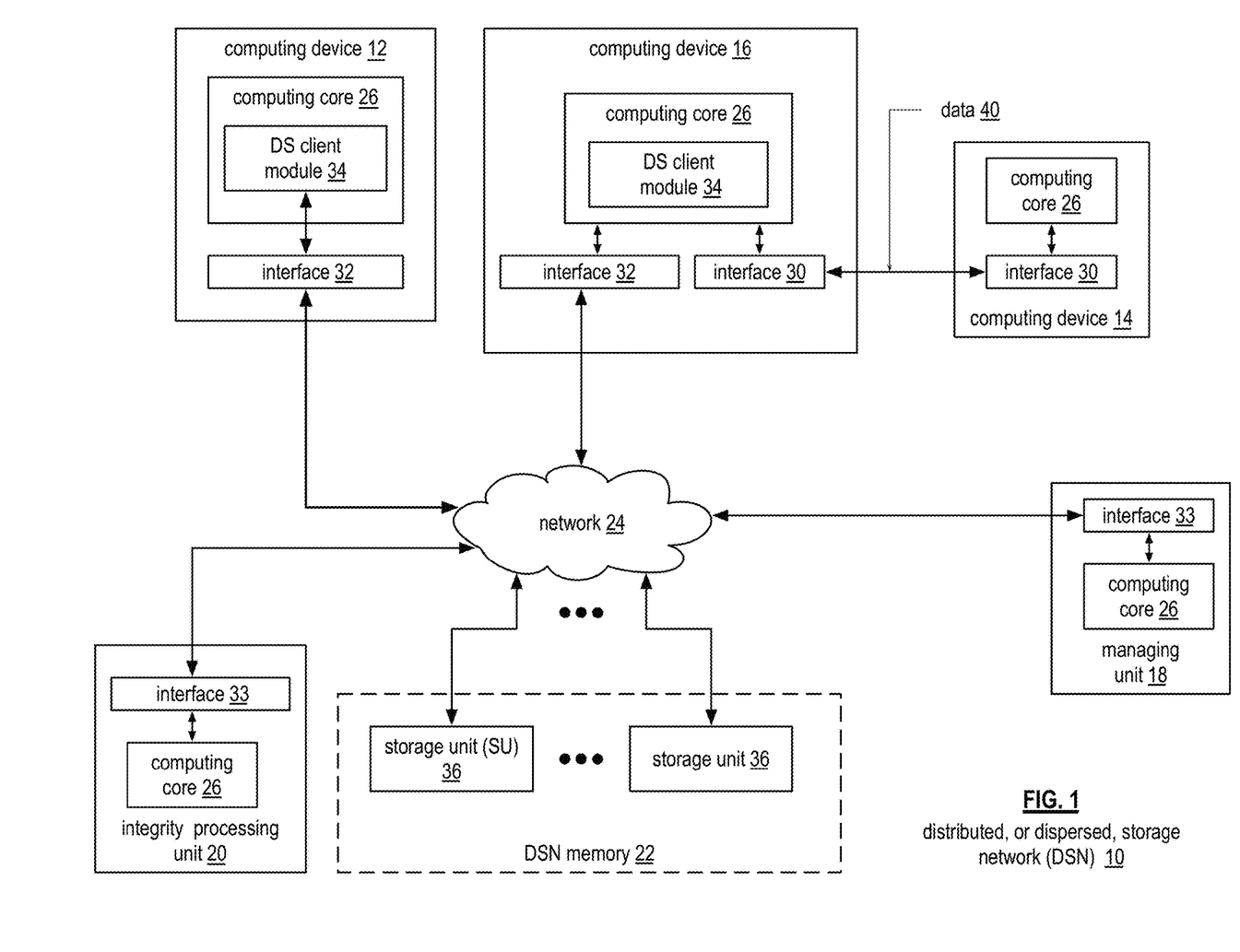
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
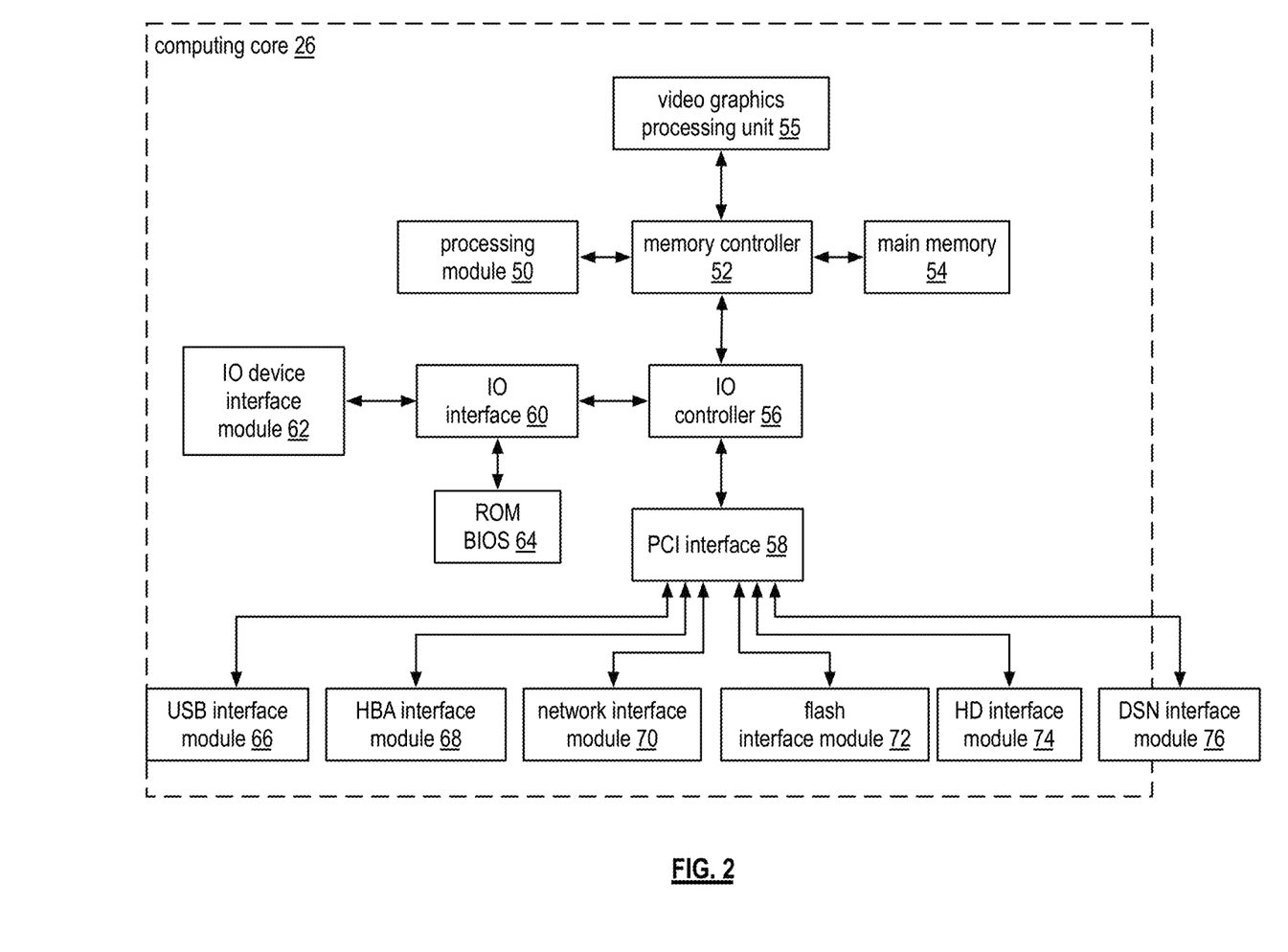
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data 40 as subsequently described with reference to one or more of FIGS. 3-8. In this example embodiment, computing device 16 functions as a dispersed storage processing agent for computing device 14. In this role, computing device 16 dispersed storage error encodes and decodes data (e.g., data 40) on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
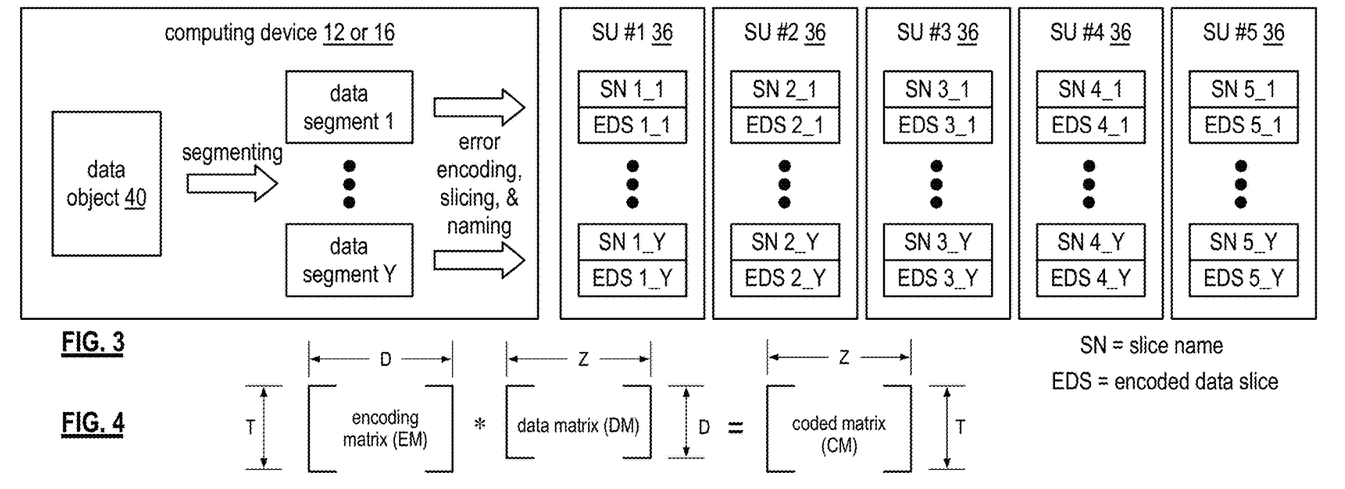
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 5:
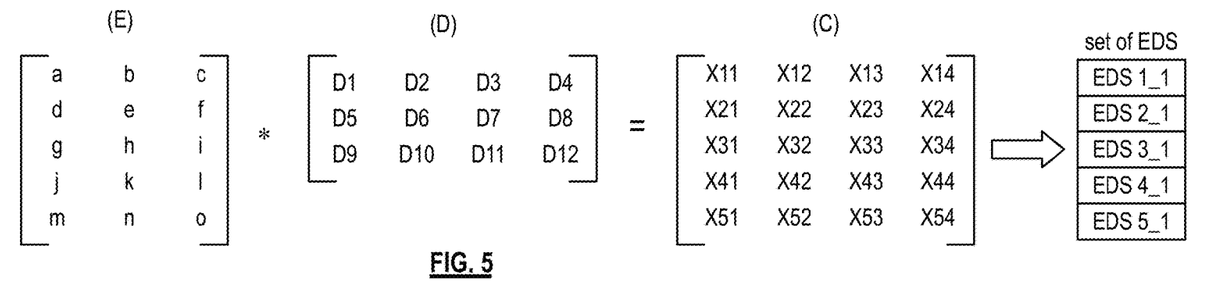
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
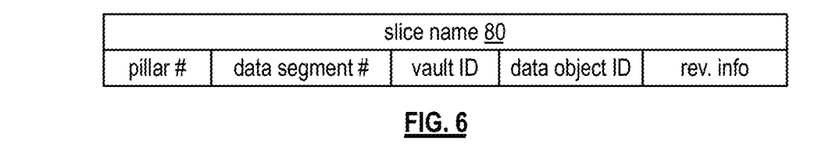
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
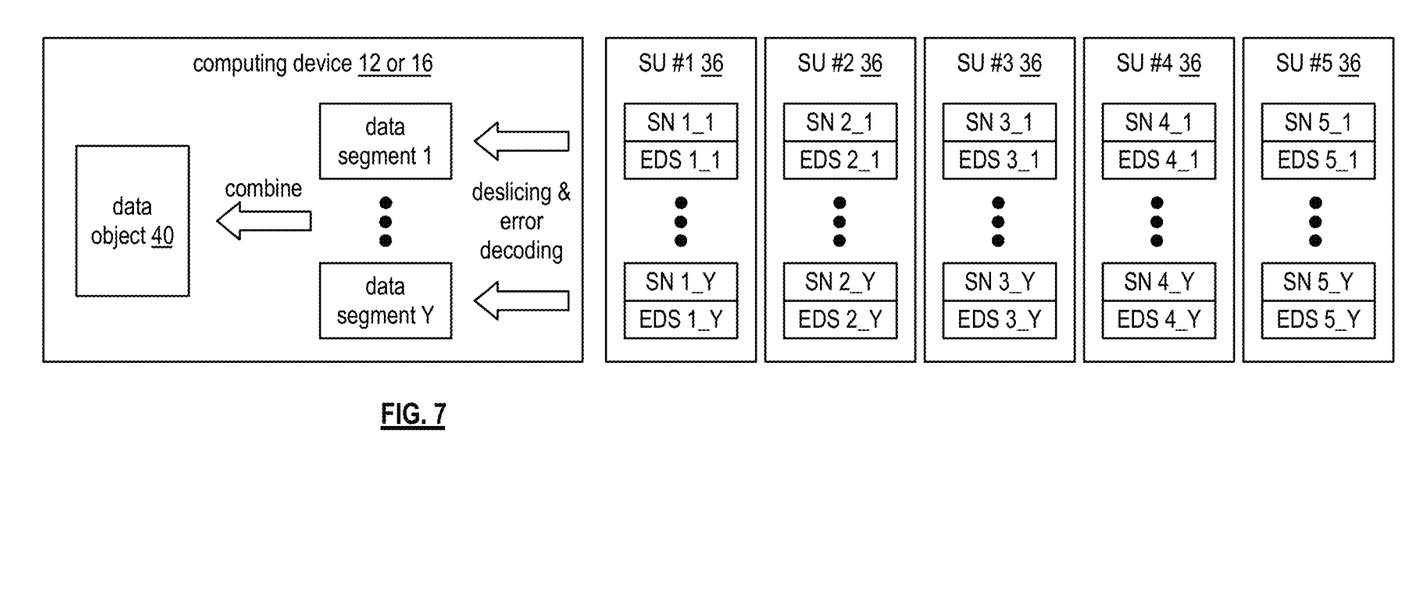
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
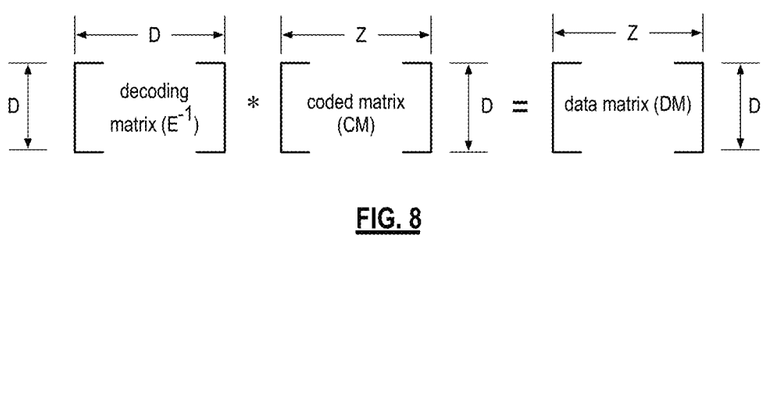
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
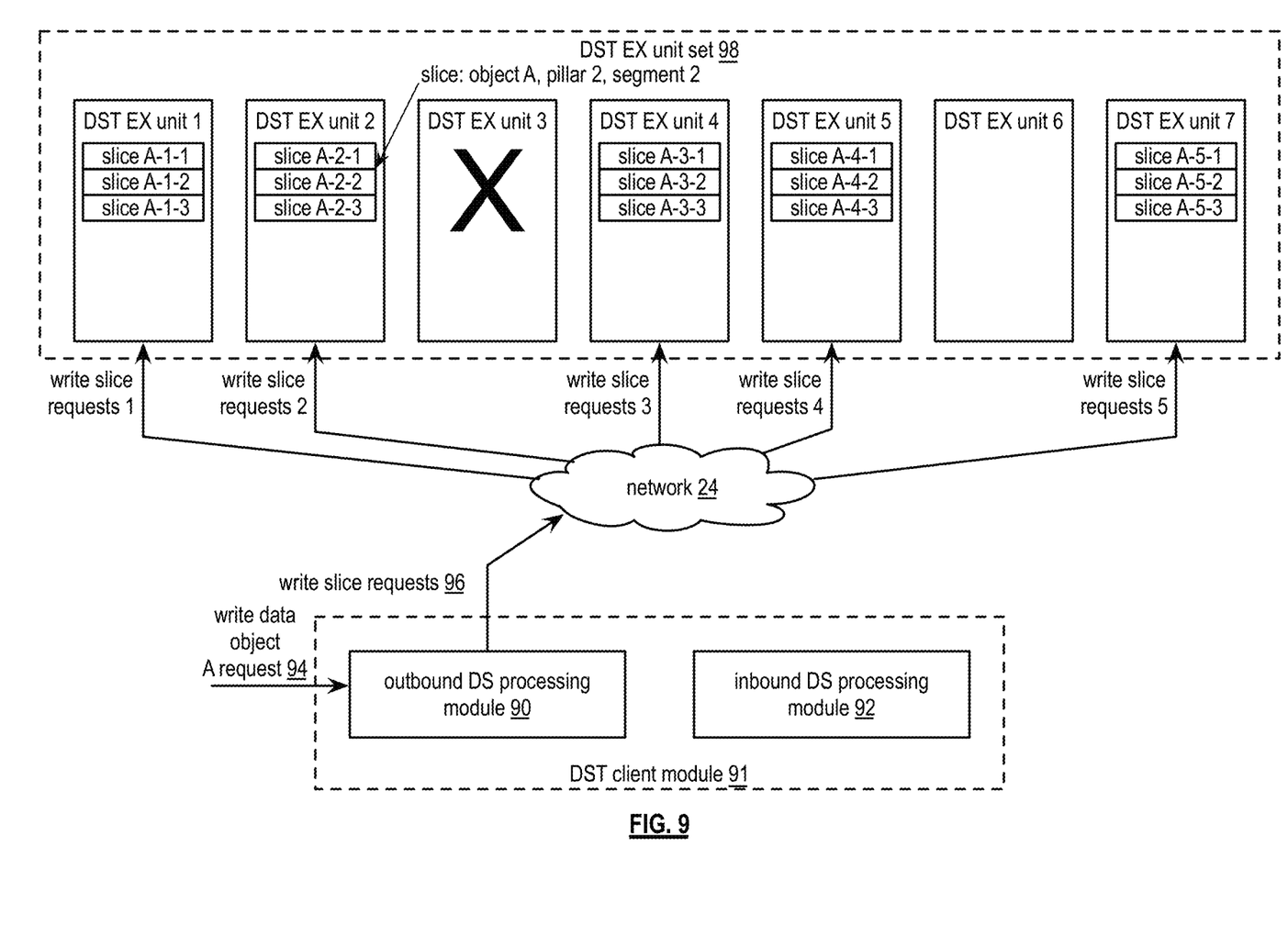
FIG. 9 is a schematic block diagram of an embodiment of another dispersed storage network (DSN)

FIG. 9 is a schematic block diagram of an embodiment of another dispersed storage network (DSN) that includes a distributed storage and task (DST) client module 91 (which may be implemented by the DS client module 34 of FIG. 1), the network 24 of FIG. 1, and a DST execution unit set 98 (which may be implemented by storage units 36 of FIG. 1). The DST execution unit set 98 includes a set of DST execution units 36. Each DST execution unit provides at least one storage slot of N storage slots. A storage slot includes at least one of a virtual storage location associated with physical memory of the DST execution unit. For example, the DST execution unit set includes DST execution units 1-7 when 7 storage slots are provided and one storage slot is associated with each DST execution unit. The DST client module 91 includes an outbound dispersed storage (DS) processing module 90 and an inbound DS processing module 92. The DS processing modules 90-92 may be implemented by a computing device 12-16 of FIG. 1. The DSN functions to store data to the set of DST execution units 1-7 and to retrieve the data from the set of DST execution units 1-7.

As a specific example of the storing the data, the DST client module 91 receives a write data object request 94 for data object A, where the write data request 94 includes a data identifier (ID) for data object A and the data object A. The outbound DS processing module 90 obtains dispersal parameters that includes an information dispersal algorithm (IDA) width and a decode threshold number. The outbound DS processing module 90 selects an IDA width number of storage slots of N storage slots associated with the DST execution unit set. As such, the selecting includes one permutation out of a number of permutations expressed by the formula: number of permutations of selecting the IDA width number of storage slots=N choose IDA width. For instance, the number of permutations of selecting the IDA width number of storage slots=7 choose 5=21 permutations. Storage of data within the DST execution unit set can tolerate a number of storage slot failures without affecting availability and reliability in accordance with a formula: number of storage slot failures tolerated=N−IDA width=7−5=2. As such, the storage of data within the DST execution unit set can tolerate 2 DST execution unit failures when each DST execution unit is associated with one storage slot, the DST execution unit set includes 7 DST execution units and the IDA width is 5.

The DST execution unit set 98 is associated with storage of encoded data slices with slice names that correspond to a common source name range. As such, the selecting of the IDA width number of storage slots includes freedom to select any storage slot of any DST execution unit since a strict DST execution unit to pillar index number relationship is not required. The selecting of the IDA width number of storage slots may be based on one or more of a DST execution unit availability indicator, a DST execution unit reliability indicator, a DST execution unit performance indicator, a DST execution unit to site association, a performance goal, a storage availability goal, a retrieval reliability goal, a predetermination, a rotation of permutations of selecting the IDA width number of DST execution units, and a look up. For example, the outbound DS processing module 90 selects the one storage slot of each of DST execution units 1, 2, 4, 5, and 7 when those units are associated with favorable availability and reliability levels and DST execution units 3 and 6 are associated with at least one of non-availability and performance below a desired performance threshold level.

Having selected the IDA width number of storage slots, the outbound DS processing module 90 encodes the data using a dispersed storage error coding function and in accordance with the dispersal parameters to produce a plurality of sets of encoded data slices. For each encoded data slice, the outbound DS processing module 90 generates a corresponding slice name producing a plurality of sets of slice names. Having an encoded the data, the outbound DS processing module 90 issues write slice requests 96 to DST execution units associated with the selected IDA width number of storage slots. For example, the outbound DS processing module 90 generates one or more sets of write slice requests 96 that includes the plurality of sets of encoded data slices and the plurality of sets of slice names. The outbound DS processing module 90 sends the one or more sets of write slice requests to the DST execution units associated with the selected IDA width number of storage slots.

As a specific example of the retrieving the data, the DST client module 91 receives a read data object request for data object A, where the write data request includes the data ID for data object A. The inbound DS processing module 92 selects a read threshold number of storage slots of the selected IDA width number of storage slots and issues read slice requests to DST execution units associated with the selected read threshold number of storage slots. The issuing includes generating addressing information, for each set of encoded data slices of the plurality of sets of encoded data slices, where the addressing information includes at least one of a source name corresponding to data object A, a vault source name corresponding to a data segment of the set of encoded data slices, and a read threshold number of slice names. The inbound DS processing module 92 generates the one or more sets of read slice requests to include the addressing information. The inbound DS processing module 92 sends the one or more sets of read slice requests to at least one of the DST execution units associated with the selected read threshold number of storage slots (e.g., based on a directory lookup), the DST execution unit set, and the DST execution units associated with the IDA width number of storage slots.

The inbound DS processing module 92 receives read slice responses that includes retrieved encoded data slices. When receiving at least a decode threshold number of encoded data slices for each set of encoded data slices, the inbound DS processing module 92 decodes (e.g., dispersed storage error decodes) the decode threshold number of encoded data slices to reproduce a data segment of a plurality of data segments of the data object A. When not receiving the at least a decode threshold number of encoded data slices for a set of encoded data slices, the inbound DS processing module 92 issues further read slice requests to other storage slots. The issuing includes selecting the other storage slots based on one or more of a DST execution unit ranking, a primary affiliation, a secondary affiliation, a query, a query response, a lookup, DST execution units not tried so far, and a predetermination.

Figure 10:
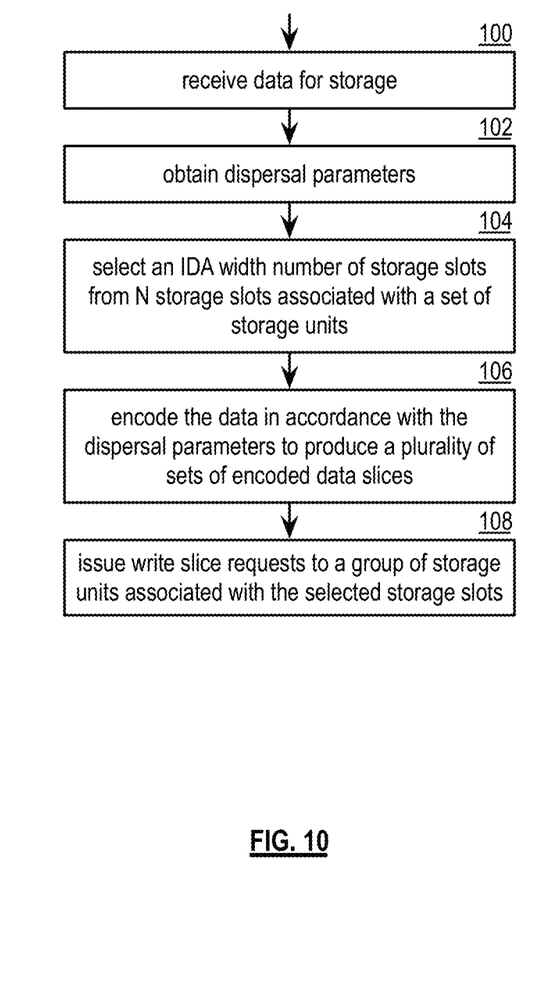
FIG. 10 is a flowchart illustrating an example of storing data.

FIG. 10 is a flowchart illustrating another example of storing data. The method begins at step 100 where a processing module (e.g., of a distributed storage and task (DST) client module 91) receives data for storage. The receiving may include receiving a data identifier (ID) associated with the data. The method continues at step 102 where the processing module obtains dispersal parameters associated with a dispersed storage error coding function. The obtaining includes at least one of performing a lookup based on the data ID, performing a lookup based on a requesting entity ID, and accessing a system registry.

The method continues at step 104 where the processing module selects an IDA width number of storage slots from N storage slots associated with a set of storage units. The selecting includes at least one of identifying a predetermined mapping of storage slots storage units, selecting based on one or more of goals for availability reliability, configuration information, and a permutation rotation algorithm. For example, the processing module selects a different permutation (e.g., compared to a previous storage sequence) for a new data object storage.

The method continues at step 106 where the processing module encodes the data using the dispersed storage error coding function and in accordance with the dispersal parameters to produce a plurality of sets of encoded data slices. The method continues at step 108 where the processing module issues write slice requests to a group of storage units associated with the selected storage slots. For example, the processing module utilizes the mapping of storage slots to storage units to identify the group of storage units, generates one or more sets of write slice requests, where each request includes an encoded data slice of a set of encoded data slices and a slice name corresponding to the encoded data slice, and sends the one or more sets of write slice requests to the identified group storage units.

Figure 11A:
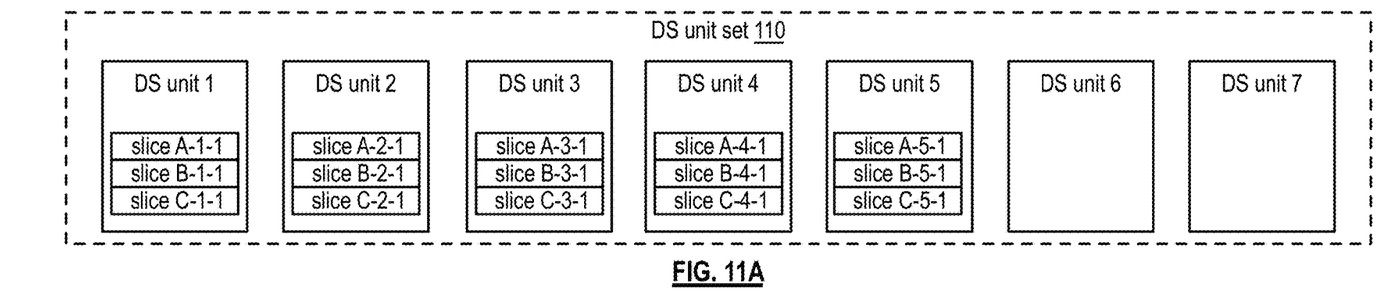
FIGS. 11A-11C are schematic block diagrams of embodiments of a dispersed storage unit set.
Figure 11B:
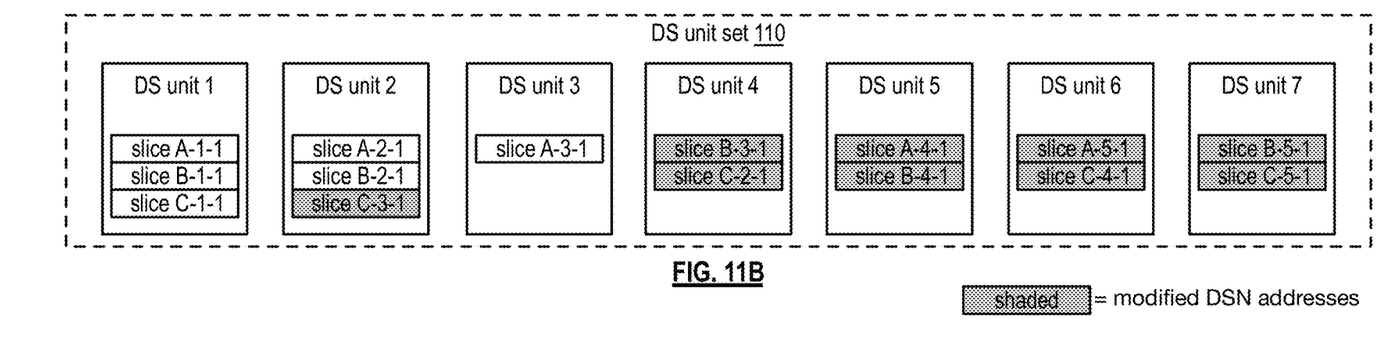
Figure 11C:
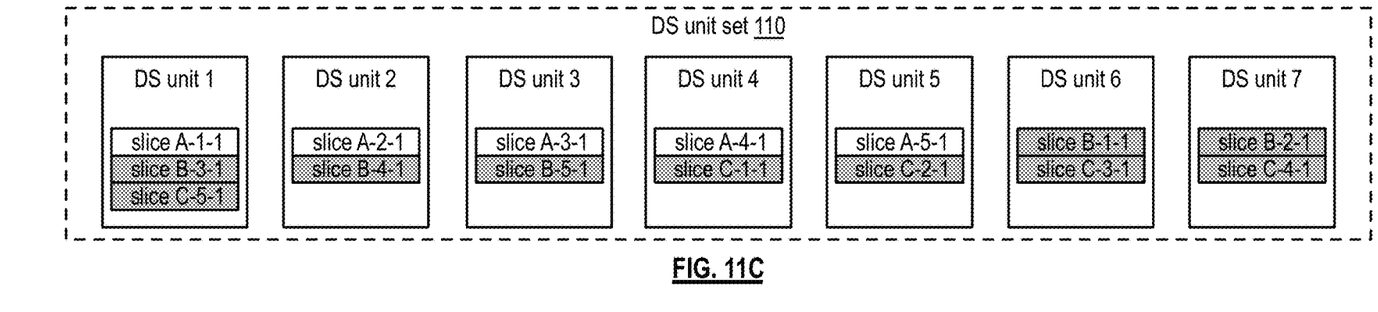

FIGS. 11A-C are schematic block diagrams of a distributed storage (DS) unit set 110 that includes DS units 1-7. Each DS unit of the set of DS unit set 110 includes one or more slots (e.g., storage locations). The DS unit set 110 is operable to store encoded data slices in accordance with a namespace range assigned to the DS unit set 110.

The namespace range may be divided up between the DS units of the DS unit set 110 in a variety of approaches. One approach is evenly across each DS unit of the DS unit set 110. For example, in a namespace of 700,000 names, a first DS unit is assigned names 000,000-099,999, a second DS unit is assigned names 100,000-199,999 and so on until a seventh DS unit is assigned names 600,000-699,999. Another approach is to divide the namespace according to capacity of each DS unit. Another approach is dividing the namespace according to historical reliability of each DS unit of the DS unit set 110. A computing device (e.g., a DS processing unit) of the DSN may determine to modify DSN addresses of encoded data slices that are stored or to be stored in the DS unit set 110.

In an example of operation of FIG. 11A, a computing device the DSN determines to store data objects A, B and C in the DS unit set 110. The computing device dispersed storage error encodes the data objects A-C in accordance with dispersed storage encoding parameters (e.g., pillar width, decode threshold, segmenting, etc.) to produce a plurality of sets of encoded data slices. In this example, a first data segment of data object A is dispersed storage error encoded to produce encoded data slices A-1-1 through A-5-1, a first data segment of data object B is dispersed storage error encoded to produce encoded data slices B-1-1 through B-5-1, and a first data segment of data object C is dispersed storage error encoded to produce encoded data slices C-1-1 through C-5-1. Note in the encoded data slice A-5-1, A is the object ID, 5 is the pillar number and 1 is the segment number.

In this example, the IDA width is five and a first DS unit 1 is responsible for storing slices of the first pillar number (e.g., slice A-1-1, slice B-1-1, slice C-1-1), a second DS unit 2 is responsible for storing slices of the second pillar number (e.g., slice A-2-1, slice B-2-1, slice C-2-1), and so on up to a fifth DS unit 5 is responsible for storing slices of the fifth pillar number (e.g., slice A-5-1, slice B-5-1, slice C-5-1). In this example, DS units 6-7 may be additional DS units for use in case one of the DS units 1-5 are unavailable or otherwise below a performance threshold.

In an example of operation of FIG. 11B, a computing device of the DSN performs a similar process to the example of FIG. 11A in creating the plurality of sets of encoded data slices. In this example, the DSN address (e.g., slice name) is modified according to a DSN address mapping function. The modification may be made after an initial set of DSN addresses is produced or may be implanted in the initial generation of the DSN addresses. The DSN address mapping function determines how many DSN addresses (e.g., 2 per data segment (e.g., set of encoded data slices)) to use the function on (e.g., to modify or to generate). The function may be one of a round robin approach, or a pseudo random approach. After modifying at least some of the DSN addresses, the computing device identifies a first group of storage units and sends the plurality of sets of encoded data slices to the first group of storage units of the DS unit set 110 for storage therein.

As a specific example, a first pillar width number is 5 (e.g., the IDA width), a second pillar width number is 7 (e.g., the number of slots (e.g., storage locations)). A computing device of the DSN creates three sets of encoded data slices (e.g., A-1-1 through A-1-1, B-5-1 through B-5-1, and C-1-1 through C-5-1). The computing device then generates DSN addresses for each the encoded data slice of the three sets of encoded data slices based on the first pillar width number, the second pillar width number and a DSN address mapping function (e.g., permutation rotation algorithm).

In this example, the shaded encoded data slices (e.g., slice C-3-1, slice B-3-1, slice C-2-1, slice A-4-1, slice B-4-1, slice A-5-1, slice C-4-1, slice B-5-1, and slice C-5-1) indicates the DSN addresses that were modified and as such change the storage location of the respective encoded data slice. Based on the DSN address the computing device identifies a first pillar width number of DS units to store each set of encoded data slices (e.g., for data object A, DS units 1, 2, 3, 5, and 6, for the first data segment of data object B, DS units 1, 2, 4, 5, and 7, etc.).

For example, slice C-3-1 would generally be stored in DS unit 3 based on its DSN address. However, the modified DSN address causes the slice C-3-1 to be stored in DS unit 2. As an example, the computing device may modify the pillar number associated with slice C-3-1 (e.g., change the pillar number of the slice name to "C-2-1"). The pillar modification may be included in the slice name. For example, the slice name 80 of FIG. 6. may be modified to include the pillar number (e.g., according to the IDA) but also a modified pillar number (e.g., one of the second pillar width numbers based on the DSN address mapping function). As another example, the computing device may store the address modifications in a DSN address table.

FIG. 11C is a schematic block diagram of another example of storing encoded data slices in accordance with a first pillar width number, a second pillar width number, and a DSN address mapping function. In this example, the DSN address mapping function operates in accordance with a round robin approach. As such, data segment of data object A is stored in DS units in the same manner while using the DSN address mapping function. For example, each encoded data slice (EDS) is stored in a DS unit with a corresponding pillar number (e.g., A-1-1 in DS unit 1, A-2-1 in DS unit 2, etc.).

However, for a data segment (e.g., a first) of data object B (represented as encoded data slices B-1-1 through B-5-1) following the round robin approach, the first pillar EDS (e.g., B-1-1) has its DSN address (e.g., slice name portion) modified so that it is stored in a slot corresponding to a sixth pillar number (e.g., to a portion of the namespace that would store a slice "A-6-1"), the second pillar EDS (e.g., B-2-1) has its DSN address modified so that is stored in storage location corresponding to a portion of the namespace that would store a slice "A-7-1", the third pillar EDS (e.g. B-3-1)

has its DSN address modified so that is stored in storage location corresponding to a portion of the namespace that would store a slice "B-1-1", the fourth pillar EDS has its DSN address modified so that is stored in storage location corresponding to a portion of the namespace that would store a slice "B-2-1", and the fifth pillar EDS (e.g., B-5-1) has its DSN address modified so that is stored in storage location corresponding to a portion of the namespace that would store a slice "B-3-1". Note in some embodiments the round robin approach may be determined with respect to other data segments of the same data object.

For example, a data object is dispersed storage error encoded into a plurality of sets of encoded data slices. The computing device determines to modify the DSN address of a first encoded data slice of a first set of encoded data slices of the plurality of sets of encoded data slices, a second encoded data slice of a second set of encoded data slices of the plurality of sets of encoded data slices, and so on. Note in some embodiments the computing device determines the DSN address mapping function based on a DSN storage protocol.

Figure 12:
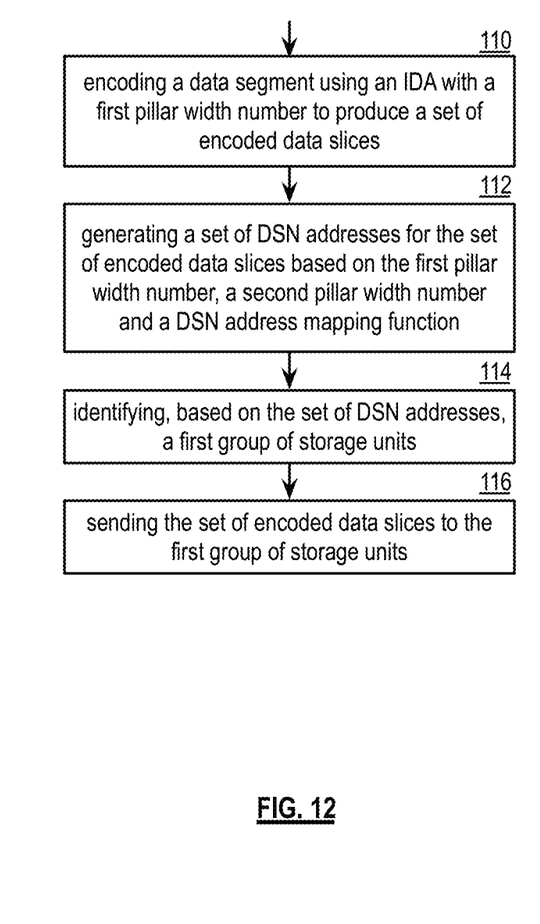
FIG. 12 is a flowchart illustrating another example of storing data.

FIG. 12 is a logic diagram of an example of a method of storing encoded data slices in a dispersed storage network (DSN). The method begins with step 110, where a computing device (e.g., DS processing unit) of the DSN encodes a data segment using an information dispersal algorithm (IDA) with a first pillar width number to produce a set of encoded data slices.

The method continues with step 112, where the computing device generates a set of DSN addresses for the set of encoded data slices based on the first pillar width number, a second pillar width number and a DSN address mapping function. Note the second pillar width number is greater than the first pillar width number. Further note that the DSN address mapping function includes one or more of a permutation rotation function, a round robin function, and a pseudo-random function.

In one example, the generating may include generating an initial set of DSN addresses of the set of encoded data slices in accordance with the IDA and modifying at least one of the initial set of DSN address based on the DSN address mapping function to produce the set of DSN addresses. In one example, the modifying includes modifying a number of the initial set of DSN address. Note in this example, the number is a difference between the first pillar width number and the second pillar width number.

The method continues with step 114, where the computing device identifies, based on the set of DSN addresses, a first group of storage units of a set of storage units. In this example, the set of storage units includes the second width pillar number of storage units and the first group of storage units includes the first pillar width number of storage units. In one example, the identifying includes determining whether a storage unit of the first group of storage units is unavailable. When the storage unit is unavailable, the storage unit is excluded from the first group. In another example, the identifying includes determining operational performance of storage units of the first group of storage units and selecting, based on the operational performance of each storage unit of the storage units, the first pillar width number of storage units of the set of storage units as the first group of storage units. Note the performance includes one or more of historical data, reliability, availability, bandwidth, processing speed, and access latency.

The method continues with step 116, where the computing device sends the set of encoded data slices to the first group of storage units in accordance with the set of DSN addresses for storage therein.

Note that the DSN address mapping function may vary from data segment to data segment and/or data object to data object. As one example, the DSN address mapping function may be a round robin approach for first data segment of a data object and may be a pseudo random approach for a second data segment of the data object. As another example, the DSN address mapping function may be a pseudo random approach for every third data segment of a data object and a round robin approach other data segments of the data object.

Note the above method may also include encoding, by the computing device (e.g., a DS processing unit), a second data segment using the information dispersal algorithm (IDA) with the first pillar width number to produce a second set of encoded data slices, generating, by the computing device, a second set of DSN addresses for the second set of encoded data slices based on the first pillar width number, the second pillar width number and the DSN address mapping function, identifying, by the computing device and based on the second set of DSN addresses, a second group of storage units of the set of storage units, wherein the second group of storage units includes the first pillar width number of storage units and wherein the second group of storage units includes at least one different storage unit of the set of storage units than is included in the first group of storage units; and sending, by the computing device, the second set of encoded data slices to the second group of storage units in accordance with the second set of DSN addresses for storage therein.

In some dispersed storage networks, the number of possible storage locations for the slices is equal to an information dispersal algorithm (IDA) width, which may create availability or reliability problems when some of the storage locations are inaccessible. One alternative may be to not write beyond a write threshold number of devices, to achieve better utilization. However, the IDA Width would still equal the number of slots. Another alternative may be creating a dispersed storage network (DSN) memory that has a number of potential storage locations (slots) greater than the width, which may allow the same advantages of less expansion factor, and greater availability is reached, but there are additional advantages.

One advantage is that a full IDA Width number of slices are always written and always produced, therefore when encoded data slices are moved between slots, no rebuild is necessary, instead the process is implemented as a straight migration (transfer or a write) from one location to the other. Another advantage is that the encoding of the encoded data slices always computes the maximum number of slices using the "identity matrix" portion of the encoding matrix. This results in a minimum amount of computation to produce all the slices regardless of which slices are being written.

For example, in a target width system with Threshold=10, Target Width=15, and True Width=20, it is using an IDA configuration that produces 20 slices, only the first 10 of which are computed efficiently (for little or no cost). Conversely, by constructing a system using Threshold=10, Width=15, and Slots=20, this system always produces 15 slices, 10 of which are computed efficiently. In the former case, up to 15 of the slices written may be computed inefficiently. When writing to a system with multiple slots, the number of availability failures tolerated is equal to (Number of Slots−IDA Width), which enables increased availability without increased expansion factor. With high enough availability for writing at full width, there may be no reason to ever write fewer than the IDA Width number of slices, and hence maximum reliability is also achieved.

Note that the number of possible storage locations is distinctive from only having additional random DS units as these extra locations are DS units capable of storing slices for some range, and which are also the same DS units which will be queried when reading slices. For improved read efficiency, there may be a set of "primary" and "secondary" locations. The primary locations are those that will be written to when possible, but may not be due to availability or performance issues. The secondary locations will be read from in cases where a consistent version cannot be determined from accessing only the primary locations. For improved read efficiency, secondary locations may from time to time, migrate slices they hold to the primary locations on which it belongs. Each slot may be represented as a "pillar" in the namespace (e.g., some fraction of the namespace having its own unique index, only the index does not refer to the "IDA index" but instead represents a "slot index").

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
    encoding, by a processing unit of a storage network, a data segment using an information dispersal algorithm (IDA) with a first pillar width number to produce a set of encoded data slices;
    generating, by the processing unit, a set of storage addresses for the set of encoded data slices based on the first pillar width number, a second pillar width number and a storage address mapping function, wherein the second pillar width number is greater than the first pillar width number;
    identifying, by the processing unit, based on the set of storage addresses, a first group of storage units of a set of storage units, wherein the set of storage units includes the second pillar width number of storage units and wherein the first group of storage units includes the first pillar width number of storage units; and
    sending, by the processing unit, the set of encoded data slices to the first group of storage units in accordance with the set of storage addresses for storage therein.

2. The method of claim 1 further comprises:
    determining whether a storage unit of the first group of storage units is unavailable; and
    when the storage unit is unavailable, excluding the storage unit from the first group.

3. The method of claim 1 further comprises:
    determining operational performance of storage units of the first group of storage units; and
    selecting, based on the operational performance of each storage unit of the storage units, the first pillar width number of storage units of the set of storage units as the first group of storage units.

4. The method of claim 1, wherein the generating comprises:
    generating an initial set of storage addresses of the set of encoded data slices in accordance with the IDA; and
    modifying at least one of the initial set of storage addresses based on the storage address mapping function to produce the set of storage addresses.

5. The method of claim 4, wherein the modifying at least one of the initial set of storage addresses comprises:
    modifying a number of the initial set of storage addresses, wherein the number is a difference between the first pillar width number and the second pillar width number.

6. The method of claim 1, wherein the storage address mapping function comprises one or more of:
    a permutation rotation function;
    a round robin function; and
    a pseudo-random function.

7. The method of claim 1 further comprises:
    encoding, by the processing unit, a second data segment using the information dispersal algorithm (IDA) with the first pillar width number to produce a second set of encoded data slices;
    generating, by the processing unit, a second set of storage addresses for the second set of encoded data slices based on the first pillar width number, the second pillar width number and the storage address mapping function, wherein the second pillar width number is greater than the first pillar width number;
    identifying, by the processing unit and based on the second set of storage addresses, a second group of storage units of the set of storage units, wherein the second group of storage units includes the first pillar width number of storage units and wherein the second group of storage units includes at least one different storage unit of the set of storage units than is included in the first group of storage units; and sending, by the processing unit, the second set of encoded data slices to the second group of storage units in accordance with the second set of storage addresses for storage therein.

8. A computing device of a storage network comprises:

a memory;

an interface; and a processing module operably coupled to the memory and the interface, wherein the processing module is operable to:

encode a data segment using an information dispersal algorithm (IDA) with a first pillar width number to produce a set of encoded data slices;

generate a set of storage addresses for the set of encoded data slices based on the first pillar width number, a second pillar width number and a storage address mapping function, wherein the second pillar width number is greater than the first pillar width number;

identify based on the set of storage addresses, a first group of storage units of a set of storage units, wherein the set of storage units includes the second pillar width number of storage units and wherein the first group of storage units includes the first pillar width number of storage units; and send, via the interface, the set of encoded data slices to the first group of storage units in accordance with the set of storage addresses for storage therein.

9. The computing device of claim 8, wherein the processing module is further operable to:

determine whether a storage unit of the first group of storage units is unavailable; and when the storage unit is unavailable, exclude the storage unit from the first group.

10. The computing device of claim 8, wherein the processing module is further operable to:

determine operational performance of storage units of the first group of storage units; and select, based on the operational performance of each storage unit of the storage units, the first pillar width number of storage units of the set of storage units as the first group of storage units.

11. The computing device of claim 8, wherein the processing module is operable to generate the set of storage addresses by:

generating an initial set of storage addresses of the set of encoded data slices in accordance with the IDA; and modifying at least one of the initial set of storage addresses based on the storage address mapping function to produce the set of storage addresses.

12. The computing device of claim 11, wherein the processing module is operable to modify the at least one of the initial set of storage addresses by:

modifying a number of the initial set of storage addresses, wherein the number is a difference between the first pillar width number and the second pillar width number.

13. The computing device of claim 11, wherein the storage address mapping function comprises one or more of:

a permutation rotation function;

a round robin function; and a pseudo-random function.

14. The computing device of claim 8, wherein the processing module is further operable to:

encode a second data segment using the information dispersal algorithm (IDA) with the first pillar width number to produce a second set of encoded data slices;

generate a second set of storage addresses for the second set of encoded data slices based on the first pillar width number, the second pillar width number and the storage address mapping function, wherein the second pillar width number is greater than the first pillar width number;

identify, based on the second set of storage addresses, a second group of storage units of the set of storage units, wherein the second group of storage units includes the first pillar width number of storage units and wherein the second group of storage units includes at least one different storage unit of the set of storage units than is included in the first group of storage units; and send, via the interface, the second set of encoded data slices to the second group of storage units in accordance with the second set of storage addresses for storage therein.

* * * * *